(12) United States Patent
Sekiguchi et al.

(10) Patent No.: US 7,732,238 B2
(45) Date of Patent: Jun. 8, 2010

(54) METHOD OF MANUFACTURING AN IMAGE SENSING APPARATUS IN WHICH TWO MEMBERS ARE BONDED TOGETHER

(75) Inventors: Yoshinobu Sekiguchi, Tokyo (JP); Takao Yonehara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 308 days.

(21) Appl. No.: 11/381,267

(22) Filed: May 2, 2006

(65) Prior Publication Data

US 2006/0199296 A1    Sep. 7, 2006

Related U.S. Application Data

(60) Division of application No. 11/031,486, filed on Jan. 7, 2005, now abandoned, which is a continuation of application No. PCT/JP2004/006593, filed on May 11, 2004.

(30) Foreign Application Priority Data

May 30, 2003    (JP)    ............................ 2003-154898

(51) Int. Cl.
*H01L 21/00* (2006.01)
(52) U.S. Cl. .............................. 438/48; 438/56; 438/57; 257/79; 257/88
(58) Field of Classification Search .................. 438/48, 438/56, 57; 257/79, 88
See application file for complete search history.

(56) References Cited

U.S. PATENT DOCUMENTS

| | | | |
|---|---|---|---|
| 5,008,206 A | 4/1991 | Shinohara et al. | 437/3 |
| 5,086,326 A | 2/1992 | Shinohara et al. | 357/30 |
| 5,610,094 A | 3/1997 | Ozaki et al. | 437/62 |
| 5,907,767 A | 5/1999 | Tohyama | 438/75 |
| 5,998,808 A | 12/1999 | Matsushita | 257/74 |
| 6,054,370 A * | 4/2000 | Doyle | 438/456 |
| 6,407,374 B1 | 6/2002 | Sato et al. | 250/208.1 |
| 6,534,336 B1 | 3/2003 | Iwane et al. | 438/71 |
| 7,294,873 B2 | 11/2007 | Suzuki et al. | 257/225 |
| 2003/0025160 A1 | 2/2003 | Suzuki et al. | 257/347 |

FOREIGN PATENT DOCUMENTS

| | | |
|---|---|---|
| JP | 64-13767 A | 1/1989 |
| JP | 5-315578 A | 11/1993 |
| JP | 9-45886 | 2/1997 |

(Continued)

*Primary Examiner*—Phuc T Dang
(74) *Attorney, Agent, or Firm*—Fitzpatrick, Cella, Harper & Scinto

(57) ABSTRACT

A solid-state image sensing apparatus having a three-dimensional structure whose manufacturing process can be simplified is provided. A solid-state image sensing apparatus formed by bonding a first member and a second member is provided. The first member has a first surface on the side of the bonding interface between the first member and the second member and a second surface on the opposite side of the bonding interface. The second member has a third surface on the bonding interface side and a fourth surface on the opposite side of the bonding interface. The first member includes photoelectric conversion elements which are formed on the first surface before the first member is bonded to the second member. The second member includes circuit elements which are formed on the third surface before bonding.

3 Claims, 13 Drawing Sheets

FOREIGN PATENT DOCUMENTS

| | | |
|---|---|---|
| JP | 09-331052 A | 12/1997 |
| JP | 10-209433 | 8/1998 |
| JP | 11-17107 | 1/1999 |
| JP | 2001-77341 | 3/2001 |
| JP | 2003-031785 A | 1/2003 |

* cited by examiner

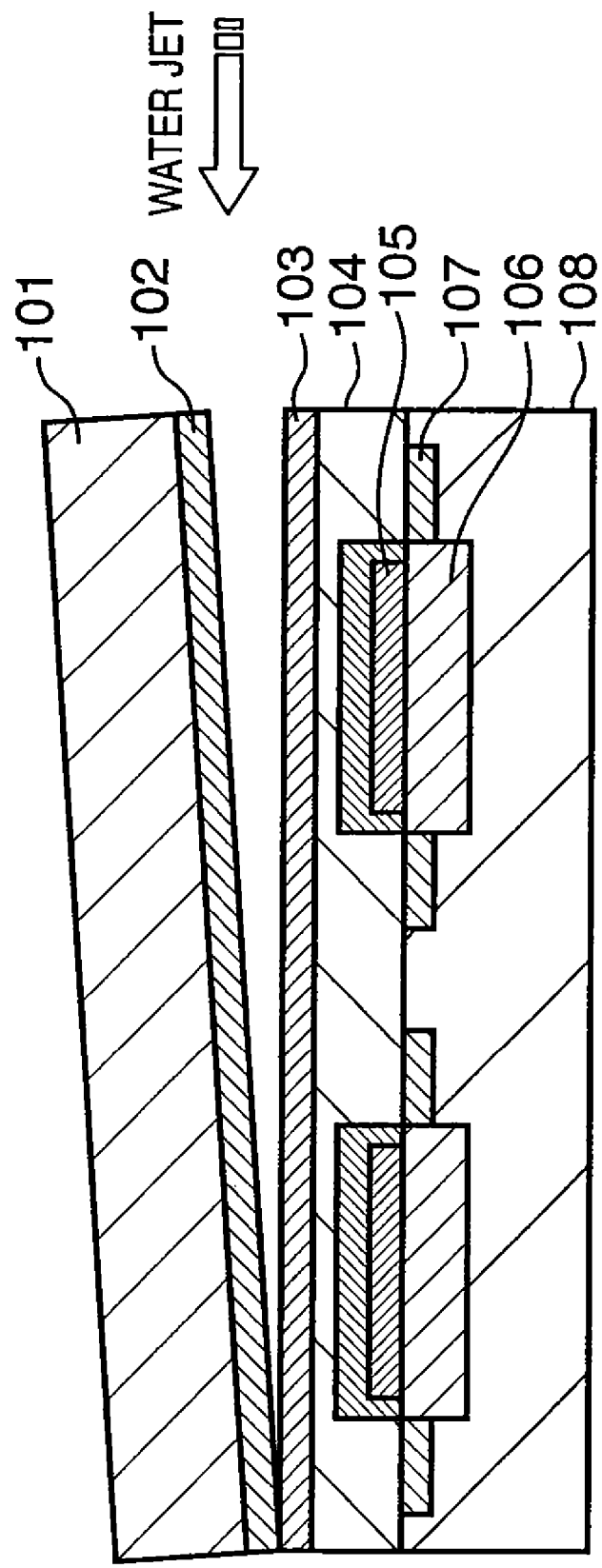

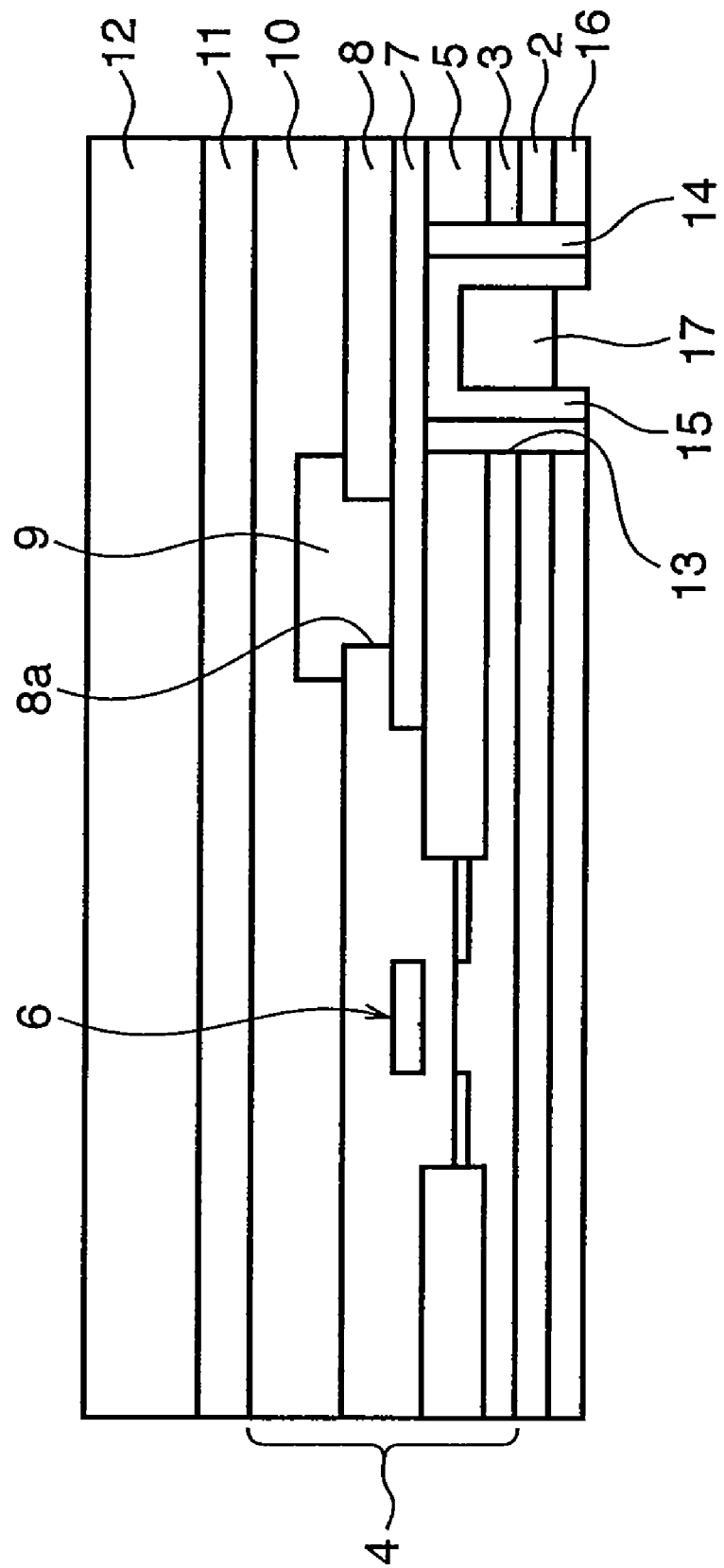

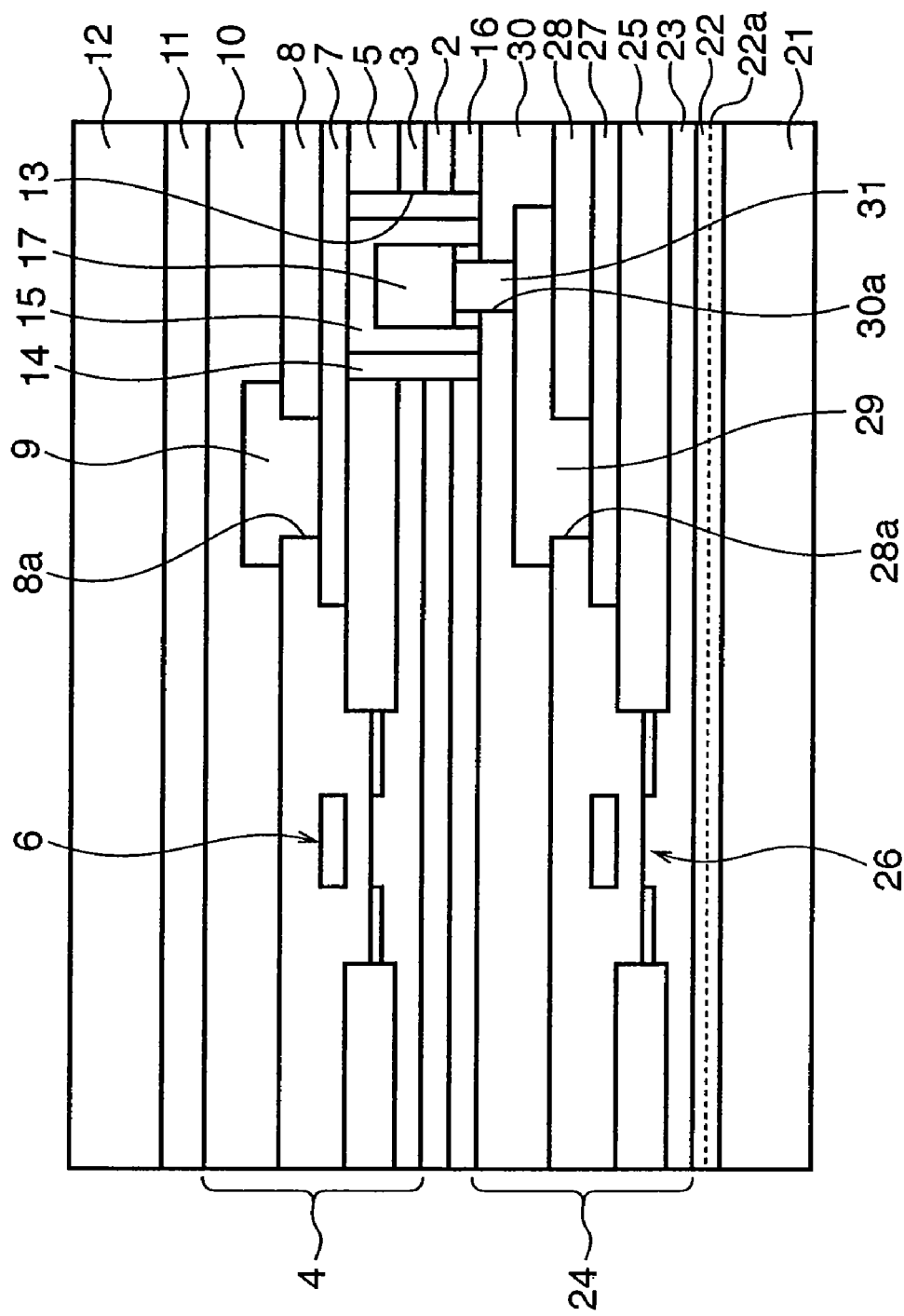

METHOD OF MANUFACTURING AN IMAGE SENSING APPARATUS IN WHICH TWO MEMBERS ARE BONDED TOGETHER

RELATED APPLICATIONS

This application is a divisional of U.S. patent application Ser. No. 11/031,486, which is a continuation of application PCT/JP2004/006593, filed May 11, 2004. This application claims benefit of the filing dates of those applications, as well as priority benefit of Japanese patent application no. 2003-154898, filed May 30, 2003. The entire contents of each of those prior applications is incorporated herein by reference.

BACKGROUND OF THE INVENTION

1. Technical Field

The present invention relates to a solid-state image sensing apparatus and a method of manufacturing the same and, more particularly, to a solid-state image sensing apparatus formed by bonding a plurality of members including a first member and a second member, and a method of manufacturing such an apparatus.

2. Related Background Art

As solid-state image sensing apparatuses, CCD image sensors and CMOS image sensors are widely used. In a solid-state image sensing element, along with a great increase in pixel density, the occupation ratio of interconnections and transistors serving as switches in each pixel increases. The ratio (aperture ratio) of the light-receiving area decreases, and accordingly, the light-receiving sensitivity becomes low. To avoid this problem, there is employed a technique for mounting a microlens in each pixel or a technique for decreasing the interconnection ratio by using a micropatterning process.

One of application purposes of a solid-state image sensing element is a retina chip. For this application purpose, an advanced function for processing input information for each pixel or high-speed processing is required. Since a memory and a signal processing circuit are added to each pixel, the aperture ratio further decreases. A promising measure against this problem is thought to be employing a so-called three-dimensional circuit element structure in which a solid-state image sensing element and a control processing circuit are stacked.

A prior-art reference about a three-dimensional circuit element is Japanese Patent Laid-Open No. 11-17107. A three-dimensional circuit element manufacturing method described in Japanese Patent Laid-Open No. 11-17107 includes steps of forming a porous layer on a semiconductor substrate, forming a single-crystal semiconductor layer on the porous layer, forming a first two-dimensional circuit element on the single-crystal semiconductor layer, bonding the first two-dimensional circuit element to a support substrate and then removing the semiconductor substrate from the bonded body so as to transfer the first two-dimensional circuit element from the semiconductor substrate to the support substrate, and bonding the support substrate to which the first two-dimensional circuit element is transferred to a substrate having a second two-dimensional circuit element.

The three-dimensional circuit element manufacturing method described in Japanese Patent Laid-Open No. 11-17107 will be described below.

First, as shown in FIG. 5A, a porous layer 2 is formed on a semiconductor substrate by anodizing. A single-crystal silicon layer 3 is formed on the porous layer 2.

As shown in FIG. 5B, a first two-dimensional LSI 4 is formed on the single-crystal silicon layer 3 formed on the porous layer 2. The two-dimensional LSI 4 includes an element isolation oxide film 5, MOSFET 6, polysilicon interconnection 7, interlayer dielectric film 8, via hole 8a, upper surface metal interconnection 9, and interlayer dielectric film 10.

As shown in FIG. 5C, polyimide 11 is applied to the surface of the two-dimensional LSI 4. A support substrate 12 is bonded to the polyimide 11.

As shown in FIG. 5D, the two-dimensional LSI 4 supported by the support substrate 12 is separated from a single-crystal silicon substrate 1.

As shown in FIG. 5E, a through hole 13 that reaches the polysilicon interconnection 7 is formed in the single-crystal silicon layer 3 and element isolation oxide film 5 on the lower surface side of the peeled two-dimensional LSI 4. An oxide film 14 is formed in the through hole 13. The oxide film 14 is partially removed by etching to expose the polysilicon interconnection 7 again. A lower surface metal interconnection 15 which comes into contact with the polysilicon interconnection 7 is formed. Polyimide 16 is applied. An Au/In pool 17 is formed in the recessed portion of the lower surface metal interconnection 15.

On the other hand, as shown in FIG. 5F, a porous silicon layer 22 and single-crystal silicon layer 23 are formed on another single-crystal silicon substrate 21 in the same way as described above. A two-dimensional LSI 24 is formed on the single-crystal silicon layer 23. The two-dimensional LSI 24 includes an element isolation oxide film 25, MOSFET 26, polysilicon interconnection 27, interlayer dielectric film 28, via hole 28a, upper surface metal interconnection 29, interlayer dielectric film 30, via hole 30a, and tungsten plug 31.

As shown in FIG. 5G, the upper surface of the two-dimensional LSI 24 shown in FIG. 5F is bonded to the lower surface of the two-dimensional LSI 4 shown in FIG. 5E via the polyimide 16 and 30.

In the same way as in FIG. 5D, the two-dimensional LSIs 4 and 24 are separated from the single-crystal silicon substrate 21.

When a necessary number of thin-film two-dimensional LSIs each formed on a single-crystal silicon layer are sequentially bonded in the above-described way, a desired three-dimensional VLSI can be completed.

In the above-described three-dimensional LSI manufacturing method, the two-dimensional LSI 4 formed on the porous layer 2 is bonded to the support substrate 12. After that, the two-dimensional LSI 4 supported by the support substrate 12 is separated from the single-crystal silicon substrate 1. A semiconductor process is executed for the separation surface to form the lower surface metal interconnection 15. The surface of the two-dimensional LSI 24 formed on another single-crystal silicon substrate 21 is bonded to the lower surface metal interconnection 15. After that, the support substrate 12 is removed by polishing or etching. That is, the layer formation process is complex.

DISCLOSURE OF INVENTION

The present invention has been made in consideration of the above-described situation, and has as its object to, e.g., simplify a manufacturing process of a solid-state image sensing apparatus or provide a solid-state image sensing apparatus which can be manufactured by a simplified manufacturing process.

A solid-state image sensing apparatus of the present invention is related to a solid-state apparatus formed by bonding a plurality of members including a first member and a second member. The first member has a first surface on a side of a bonding interface between the first member and the second member and a second surface on an opposite side of the bonding interface, and the second member has a third surface on a side of the bonding interface and a fourth surface on an opposite side of the bonding interface. The first member includes photoelectric conversion elements which are formed on the first surface before the first member is bonded to the second member, and the second member includes circuit elements which are formed on the third surface before bonding. The photoelectric conversion elements of the first member are electrically connected to the circuit elements of the second member.

According to a preferred aspect of the present invention, the circuit elements of the second member preferably include circuits which control the photoelectric conversion elements and/or circuits which process signals obtained from the photoelectric conversion elements. In addition, preferably, the photoelectric conversion elements are arranged to form a plurality of pixels which are two-dimensionally arrayed, and the circuit elements of the second member are arranged to form a plurality of circuits which are two-dimensionally arrayed in correspondence with said plurality of pixels.

According to the preferred aspect of the present invention, the first member is preferably configured to make light incident on the photoelectric conversion elements through the second surface.

According to the preferred aspect of the present invention, the apparatus preferably further comprises an anti-reflection film and/or color filter on a side of the second surface of the first member.

According to the preferred aspect of the present invention, a film which shields or attenuates light is preferably formed on the bonding interface between the first member and the second member.

A method of manufacturing a solid-state image sensing apparatus according to the present invention comprises a first step of forming photoelectric conversion elements on a first surface of a first member which has the first surface and a second surface, a second step of forming circuit elements on a third surface of a second member which has the third surface and a fourth surface, and a third step of making a side of the first surface of the first member oppose a side of the third surface of the second member to form a bonded body of the first member and the second member.

According to a preferred aspect of the present invention, the circuit elements formed in the second step preferably include circuits which control the photoelectric conversion elements and/or circuits which process signals obtained from the photoelectric conversion elements.

According to the preferred aspect of the present invention, the method preferably further comprises a step of forming an anti-reflection film and/or color filter on a side of the second surface of the first member.

According to the preferred aspect of the present invention, the first step preferably includes a step of forming a film which shields or attenuates light on the side of the first surface of the first member.

According to the preferred aspect of the present invention, the second step preferably includes a step of forming a film which shields or attenuates light on the side of the third surface of the second member.

According to the preferred aspect of the present invention, preferably, the first step includes a step of forming a separation layer on the first member and a step of forming the circuit elements above the separation layer of the first member, and the manufacturing method further comprises a step of separating the first member at the separation layer after the bonded body is formed.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIGS. 1A to 1F are sectional views showing steps in manufacturing a three-dimensional semiconductor device according to a preferred embodiment of the present invention;

FIGS. 5A to 5G are sectional views showing steps in manufacturing a three-dimensional circuit element described in Japanese Patent Laid-Open No. 11-17107.

BEST MODE FOR CARRYING OUT THE INVENTION

FIGS. 1A to 1F show steps in manufacturing a three-dimensional semiconductor device according to a preferred embodiment of the present invention.

The structure of the three-dimensional semiconductor device according to the preferred embodiment of the present invention will be described with reference to FIGS. 1E and 1F. The three-dimensional semiconductor device according to the preferred embodiment of the present invention is formed by bonding a first member (e.g., a semiconductor such as single-crystal silicon) 104 to a second member (e.g., a semiconductor such as single-crystal silicon) 108. The first member 104 has a first surface on the side of the bonding interface between the first member 104 and the second member 108 and a second surface on the opposite side of the bonding interface. The second member 108 has a third surface on the bonding interface side and a fourth surface on the opposite side of the bonding interface. The first member 104 includes circuit elements (e.g., light-receiving units arranged in an array) 105 which are formed on the first surface before bonding the first member 104 to the second member 108. The second member 108 includes circuit elements (e.g., circuit elements to control the light-receiving units and/or circuit elements to store and/or process signals obtained from the light-receiving units) 106 which are formed on the third surface before bonding the first member 104 to the second member 108.

The three-dimensional semiconductor device according to the preferred embodiment of the present invention and a method of manufacturing the three-dimensional semiconductor device will be described below with reference to FIGS. 1A to 1F.

Figure 1A:
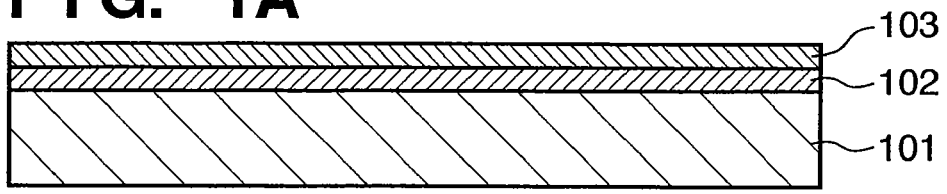

First, as shown in FIG. 1A, one or a plurality of porous silicon layers serving as separation layers are formed by anodizing or the like on a single-crystal silicon substrate 101 as a first semiconductor substrate. A description will be done below assuming that two porous silicon layers 102 and 103 are formed on the single-crystal silicon substrate 101. When anodizing is used, a porous layer is formed from the surface to the deep part. When two or more porous layers should be formed, preferably, the porous layer 103 with a low porosity is formed first, and then, the porous layer 102 with a high porosity is formed. Accordingly, the porous layer 103 with a low porosity is formed on the surface side. The porous layer 102 with a high porosity is formed under the porous layer 103. According to a thus characterized multilayered structure, a step of filling holes that exist in the substrate surface before epitaxial growth can be facilitated. In addition, the single-crystal silicon substrate 101 can easily be separated after the two semiconductor substrates are bonded.

Instead of forming a porous silicon layer, an ion-implanted layer may be formed by implanting hydrogen ions or the like to a region at a predetermined depth of the first semiconductor substrate (first member) 101. Such an ion-implanted layer can also function as a separation layer.

Figure 1B:
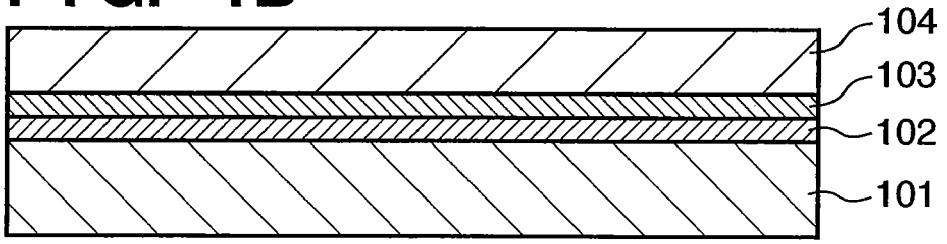

Next, holes that exist in the surface of the porous silicon layer 103 are filled by high-temperature hydrogen annealing and CVD using $SiH_4$ or $SiCl_4$ as a source gas, thereby forming a satisfactory crystal surface on the surface of the porous silicon layer 103. In addition, as shown in FIG. 1B, a single-crystal silicon layer (semiconductor layer) 104 is epitaxially grown on the porous silicon layer 103.

The impurity concentration and thickness of the single-crystal silicon layer 104 as an epitaxial growth layer depend on the design of the device (circuit element) to be formed. Typically, the impurity concentration is $10^{14}$ to $10^{17}/cm^3$, and the thickness is 10 .mu.m or less. The controllability of the thickness of the epitaxial growth layer is very high. Hence, the single-crystal silicon layer 104 having the optimum thickness for the device can easily be obtained.

Figure 1C:
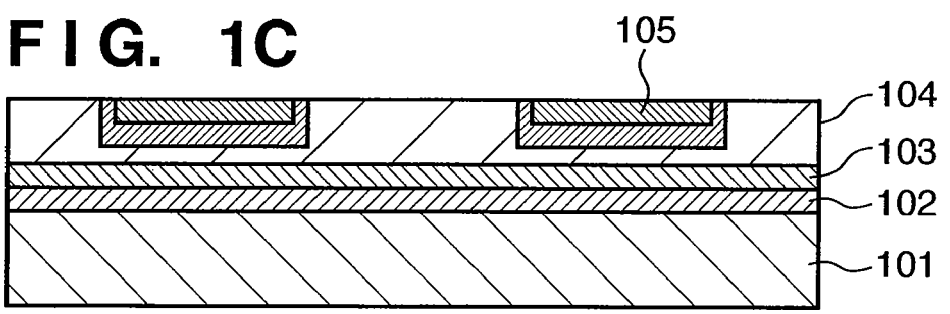

As shown in FIG. 1C, the light-receiving units 105 of a solid-state image sensing apparatus (e.g., a CCD image sensor or CMOS image sensor) are formed in the single-crystal silicon layer 104 by a normal semiconductor process. The light-receiving units 105 include circuit elements which are two-dimensionally arrayed. The light-receiving units 105 include CCDs or photoelectric conversion elements having a CMOS structure.

Figure 1D:
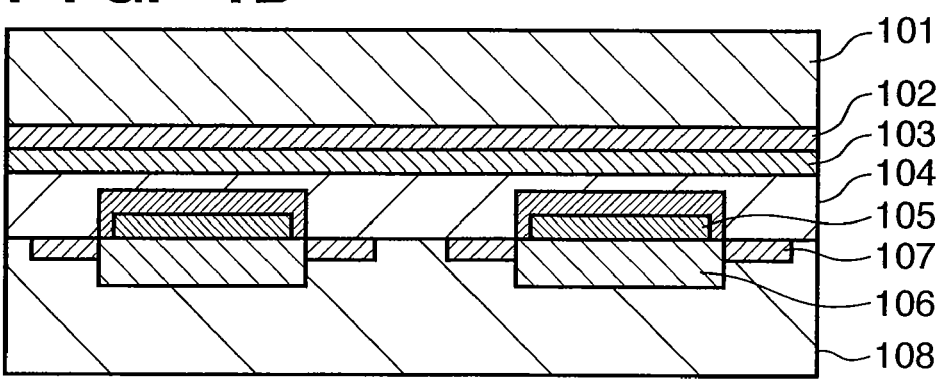

As shown in FIG. 1D, the circuits (e.g., the control circuits of the light-receiving units, image signal processing circuits, and memories) 106 having a function of controlling the light-receiving units 105 of the solid-state image sensing apparatus and/or storing and/or processing signals obtained from the light-receiving units 105 are formed on the surface of the second semiconductor substrate 108 by a normal semiconductor process. The light-receiving units 105 formed on the first semiconductor substrate 101 are bonded to the surface of the second semiconductor substrate 108 in a face-down state. With this bonding, the circuit elements that form the light-receiving units 105 are electrically connected to the circuit elements that form the circuits 106 on the side of the second semiconductor substrate 108. This bonding can be executed at a relatively low temperature of, e.g., 350.degree. C. or less. Since this temperature is lower than the highest temperature in the process of the circuit elements formed on the respective substrates, the element characteristic does not degrade. The circuit elements that form the light-receiving units 105 and the circuit elements that form the circuits 106 on the side of the second semiconductor substrate 108 can electrically be connected to each other by bonding electrodes prepared for the respective elements. In this case, no plugs for electrical connection between layers are necessary, unlike the prior art.

In addition to the light-receiving units 105, some of functional circuits which control the light-receiving units 105 and/or store and/or process signals obtained from the light-receiving units 105 may be formed on the first semiconductor substrate 101. Distribution of the circuits to be formed on the first semiconductor substrate 101 and second semiconductor substrate 108 is optimized in accordance with the device design, process design, and circuit design.

Each light-receiving unit 105 is formed as a CMOS sensor structure, and circuits having a function of storing and/or processing signals for the respective pixels are formed on the surface of the second semiconductor substrate 108 so that two-dimensional input signals to the circuits can be processed in parallel. With this structure, a high-speed operation and feedback control are possible. Hence, a high-performance retina chip can be implemented.

The two semiconductor substrates 101 and 108 bonded to each other are separated near the porous layers 102 and 103 formed on the first semiconductor substrate 101. Since large stress is applied to the porous layers, and their densities are low, the etching rate is high. Hence, the first semiconductor substrate 101 can be separated by etching the porous layers 102 and 103 from their sides or applying external stress to the porous layers 102 and 103. However, a method of separating the first semiconductor substrate 101 by injecting a focused fluid such as a high-pressure current (water jet) near the porous silicon layers 102 and 103, as shown in FIG. 1E, is a more reliable and superior method.

The surface formed by separating the first semiconductor substrate 101 at the porous layer is subjected to porous silicon layer removal by etching, planarization by CMP (Chemical Mechanical Polishing), and passivation film formation, as needed.

To form a color solid-state image sensing apparatus, a step of forming a color filter on the light incident surface can be added.

Signals stored or processed by the circuits 106 formed on the second semiconductor substrate 108 can be extracted through electrode pads 107 connected to the circuits 106. The signals can be extracted from the electrode pads 107 by, e.g., removing part (unnecessary regions except the regions where the light-receiving units 105 are formed) of the single-crystal silicon layer 104 to expose the electrode pads 107 and executing wire bonding for the exposed electrode pads 107, as shown in FIG. 1F. Alternatively, as shown in FIG. 2, electrode pads 110 are formed on the upper surface side (separation surface side) of the single-crystal silicon layer 104 and connected to the electrode pads 107 through plugs 109. In this case, the signals can be extracted through the electrode pads 110.

In a three-dimensional semiconductor device which can be manufactured as described above, the upper surface (first surface) side of the first semiconductor substrate (single-crystal silicon layer 104) 101, on which the light-receiving units 105 are formed, is bonded to the upper surface (third surface) side of the second semiconductor substrate 108. The lower surface (second surface; the interface to the polysilicon layer) side of the single-crystal silicon layer 104 of the first semiconductor substrate 101 is arranged on the opposite side (i.e., the light incident surface side) of the bonding interface between the first semiconductor substrate 101 and the second semiconductor substrate 108.

For the first semiconductor substrate 101 separated from a the porous silicon layer 102, surface polishing is executed to decrease the thickness after the porous silicon layer remaining on the surface is removed. Since the same state as before the process can be obtained, the first semiconductor substrate can repeatedly be used. Accordingly, the manufacturing cost can be reduced.

As the second semiconductor substrate, a substrate made of, e.g., germanium (Ge), gallium arsenide (GaAs), gallium phosphide (GaP), or indium phosphide (InP) may be employed in place of the silicon substrate. When first and second semiconductor substrates which are made of different materials are used, a device including different kinds of materials can be implemented.

Any substrate can be used as the first semiconductor substrate if a porous layer can be formed on it, and a single-crystal layer can be formed on the porous layer. In addition to a silicon substrate, a germanium substrate may be used.

Any epitaxial layer can be formed on the porous layer independently of the crystal of the substrate as long as they have close lattice constants. For example, a silicon substrate is used as the substrate, and a germanium layer or silicon-germanium mixed crystal layer is formed as the epitaxial layer on the porous layer. Alternatively, a germanium substrate is used as the substrate, and a gallium arsenide layer is formed as the epitaxial layer.

Figure 1F:
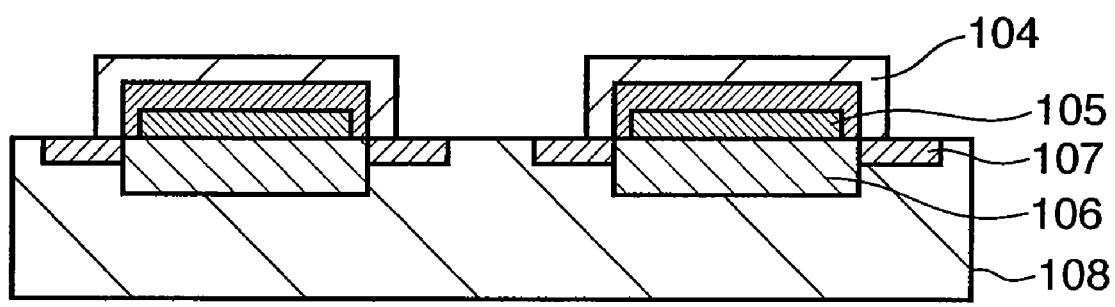
Figure 2:
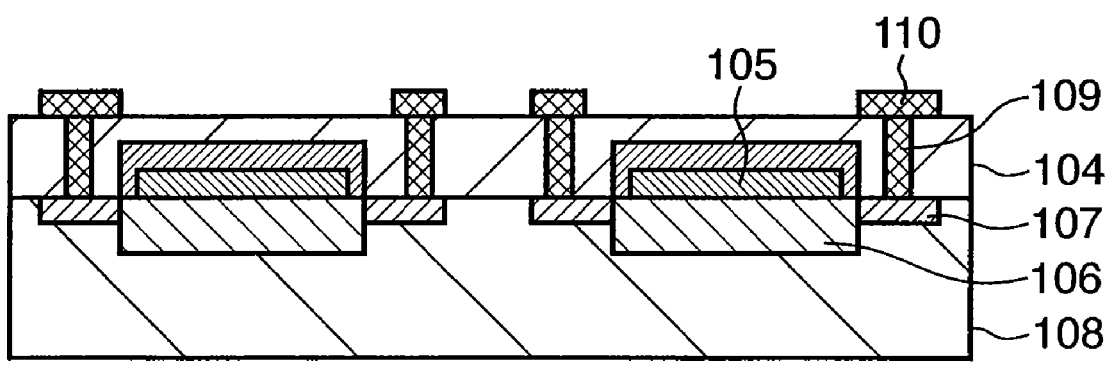
FIG. 2 is a sectional view showing a structure of the three-dimensional semiconductor device according to the preferred embodiment of the present invention.
Figure 3:
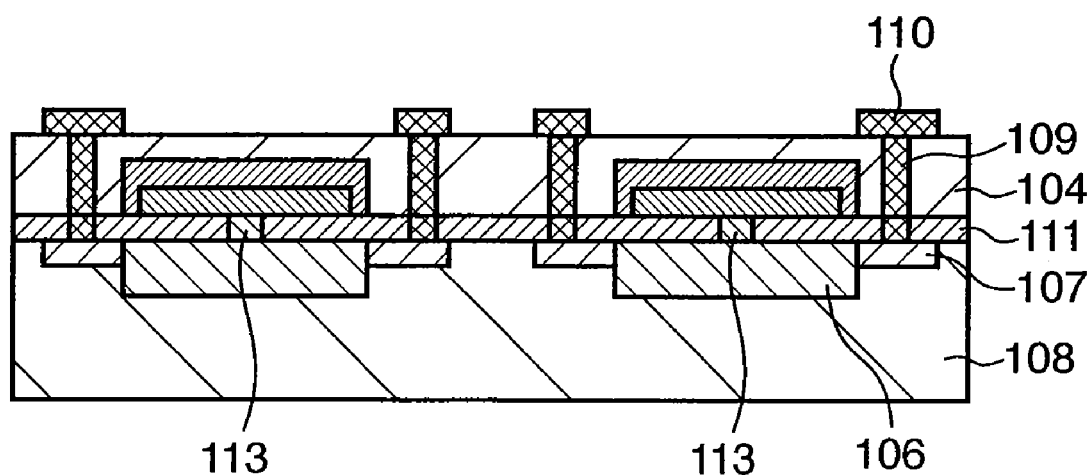
FIG. 3 is a sectional view showing another structure of the three-dimensional semiconductor device according to the preferred embodiment of the present invention.

FIG. 3 is a sectional view showing a modification of the three-dimensional semiconductor device shown in FIGS. 1F and 2. As shown in FIG. 3, a film 111 which shields or attenuates light is preferably formed between the single-crystal silicon layer 104 and the second semiconductor substrate 108 to prevent any light from entering the circuits 106 formed on the second semiconductor substrate 108. When the film 111 is formed, any operation error of the circuits 106 can be prevented. The film 111 may be formed either on the entire surface of the second semiconductor substrate 108 or only on part of the surface of the second semiconductor substrate 108. The film 111 can be formed on the single-crystal silicon layer 104, e.g., after the light-receiving units 105 are formed on the first semiconductor substrate 101 before the first semiconductor substrate 101 is bonded to the second semiconductor substrate 108. Alternatively, the film 111 may be formed on the surface of the second semiconductor substrate 108 after the circuits 106 are formed on the second semiconductor substrate 108 before the first semiconductor substrate 101 is bonded to the second semiconductor substrate 108.

Figure 4:
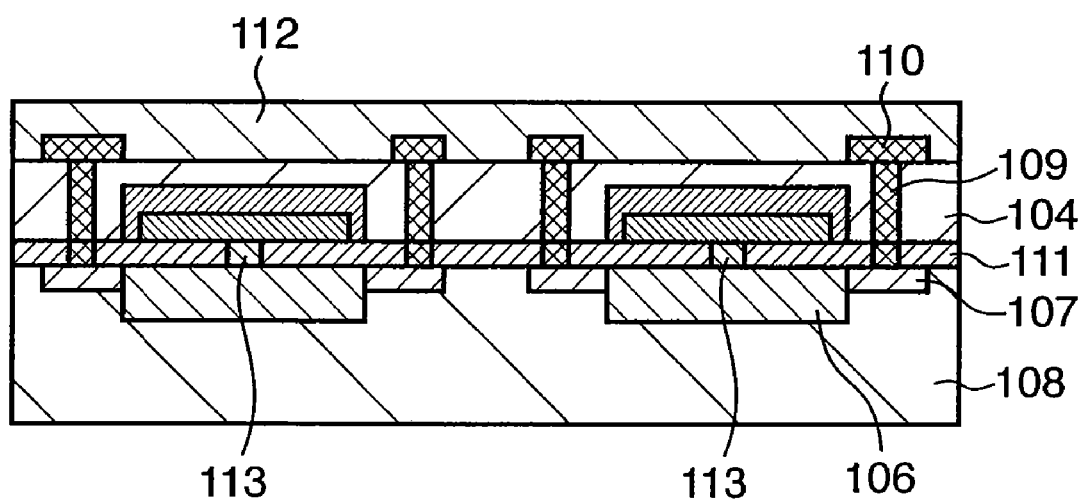
FIG. 4 is a sectional view showing still another structure of the three-dimensional semiconductor device according to the preferred embodiment of the present invention.
Figure 5A:
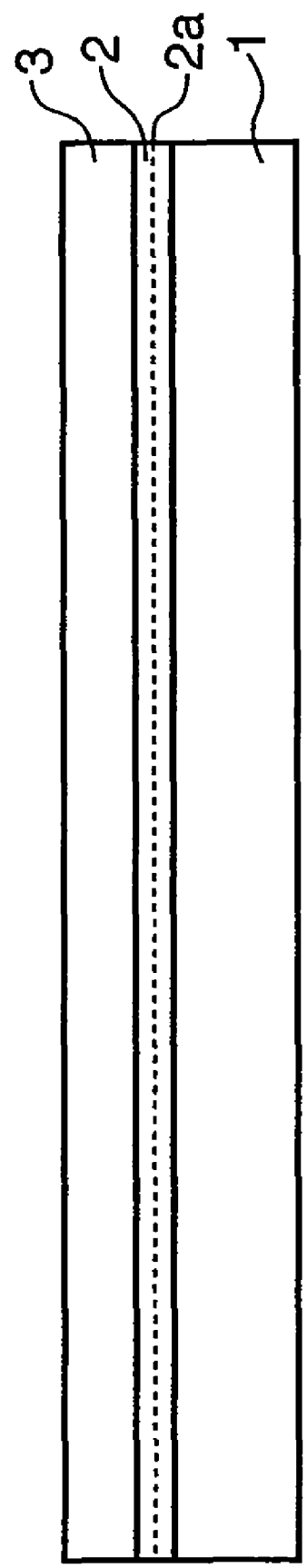
Figure 5B:
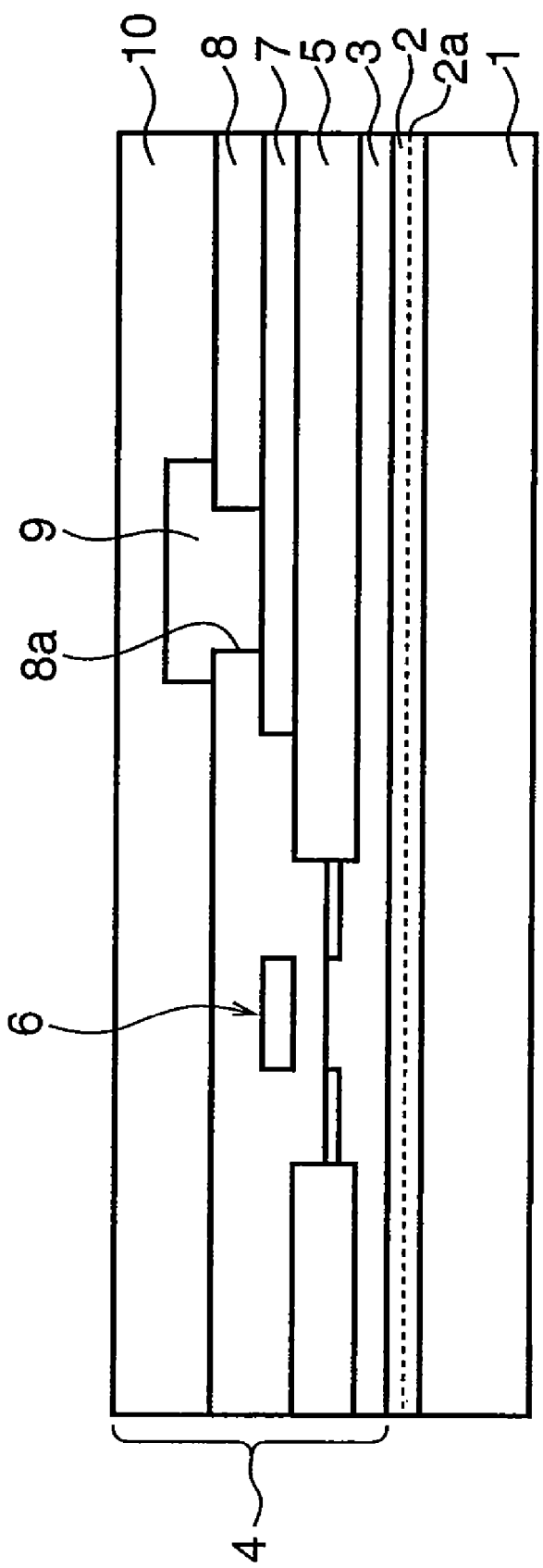
Figure 5C:
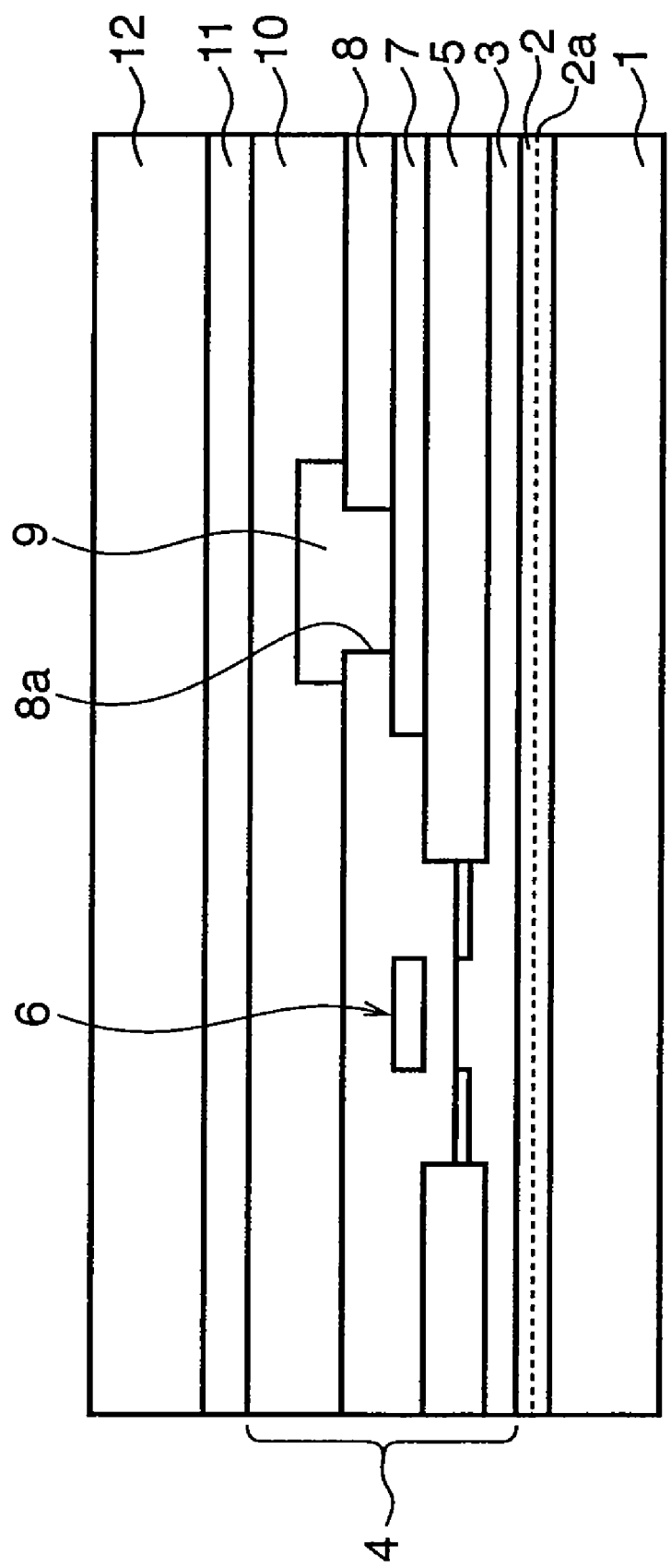
Figure 5D:
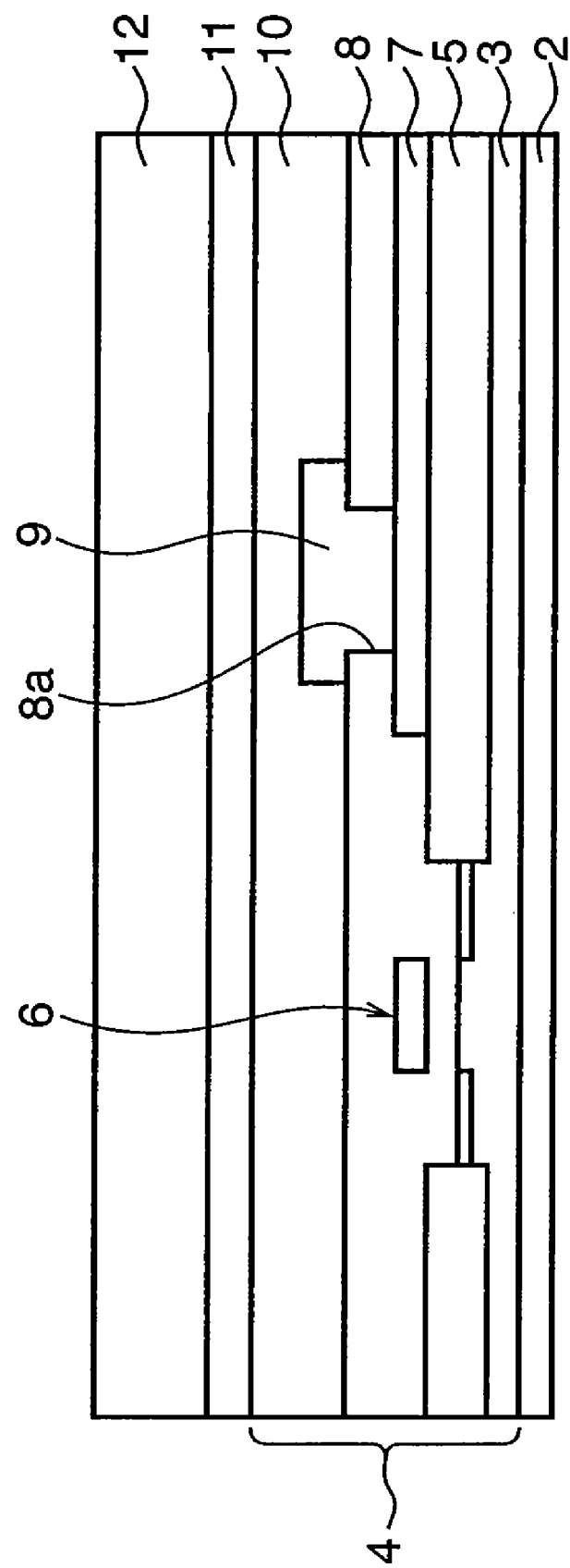
Figure 5F:
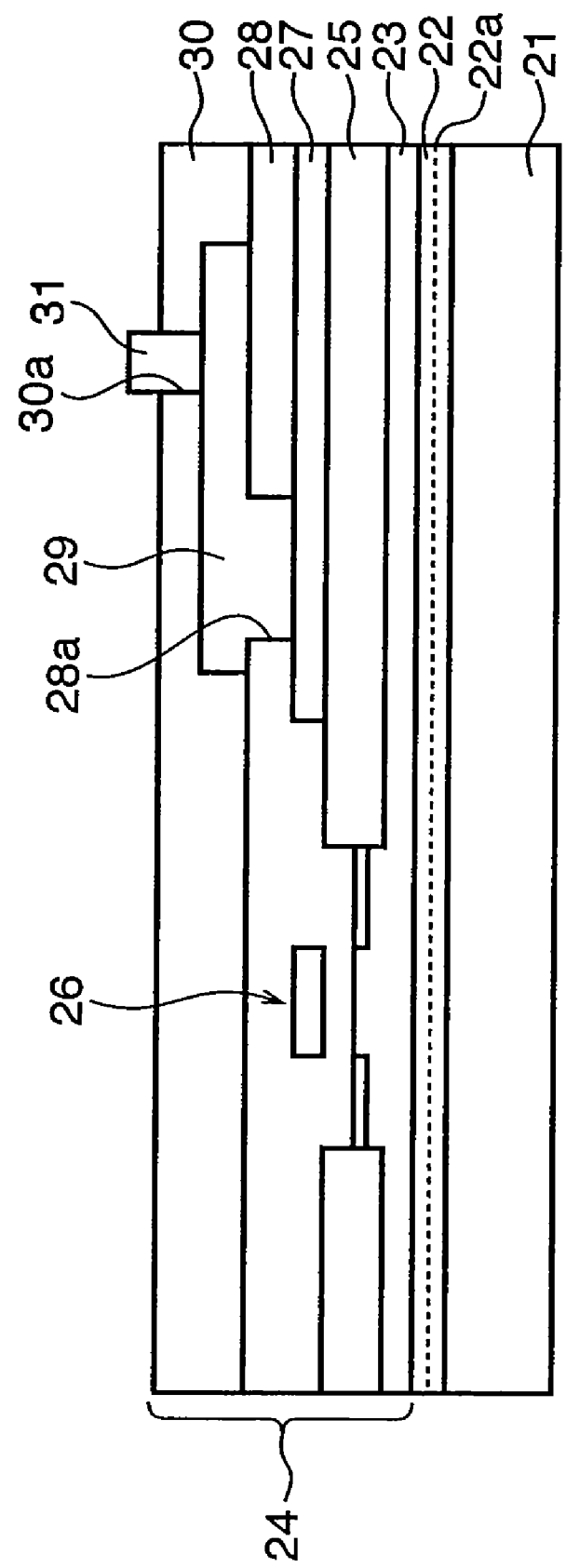

FIG. 4 is a sectional view showing another modification of the three-dimensional semiconductor device. As shown in FIG. 4, an anti-reflection film and/or color filter 112 can be formed on the surface of the three-dimensional semiconductor device.

A semiconductor device formed as an integrated circuit including the above-described solid-state image sensing element can suitably be used as a constituent component of an image processing apparatus including an electronic camera such as a digital still camera or digital movie camera, or a freestanding system or freestanding robot which operates in accordance with a processing result by such an image processing apparatus.

As a detailed example of the present invention, a method of manufacturing a CMOS image sensor (solid-state image sensing element) will be described below with reference to FIGS. 1A to 1F.

First, as shown in FIG. 1A, two porous silicon layers 102 and 103 are formed by anodizing on a single-crystal silicon substrate 101 serving as a first semiconductor substrate. At this time, the porous layer 103 with a low porosity is formed first. Subsequently, the porous layer 102 with a high porosity is formed. Accordingly, the step of filling holes that exist in the substrate surface before epitaxial growth can be facilitated. In addition, the single-crystal silicon substrate 101 can easily be separated after the two semiconductor substrates are bonded.

Next, holes that exist in the surface of the porous silicon layer are filled by high-temperature hydrogen annealing and CVD using SiH.sub.4 or SiCl.sub.4 as a source gas, thereby forming a satisfactory crystal surface on the surface of the porous silicon layer 103. In addition, as shown in FIG. 1B, a single-crystal silicon layer 104 is epitaxially grown.

The thickness of the epitaxial growth layer 104 is about 10 .mu.m or less, although it depends on the design of an individual CMOS image sensor.

As shown in FIG. 1C, sensor units 105 of the CMOS image sensor are formed in the epitaxial layer 104 by using a normal semiconductor process.

On the other hand, circuits 106 and electrode pads 107, which include circuits formed for the elements in a one-to-one correspondence, are formed on the surface of another single-crystal silicon substrate 108 serving as a second semiconductor substrate by a normal semiconductor process to control the elements that form the sensor units 105 of the CMOS image sensor and process signals obtained from the elements. Peripheral circuits which do not correspond to the elements that form the sensor units 105 and are necessary for image sensor control and signal output are formed around the circuits 106. As shown in FIG. 1D, the sensor units 105 of the CMOS image sensor which are formed on the first semiconductor substrate 101, are bonded to the circuits 106 formed on the surface of the second semiconductor substrate 108 in a face-down state.

To directly connect the electrodes of the sensor units 105 of the CMOS image sensor to the corresponding electrodes of the circuits 106 for control and processing, each electrode (not shown) preferably has a projecting shape. In addition, to prevent incident light that has passed through the sensor units 105 of the CMOS image sensor from becoming a noise source in the circuits 106, a shielding film 111 as shown in FIG. 3 or 4 is preferably formed on the surfaces of the sensor units 105 or the surface of the second semiconductor substrate 108 (circuits 106) before or at the time of bonding the first semiconductor substrate 101 to the second semiconductor substrate 108.

As shown in FIG. 1E, a focused high-pressure current (water jet) is injected near the porous layers 102 and 103 of the two semiconductor substrates bonded to each other, thereby separating the first semiconductor substrate 101 at the portion of the porous layers 102 and 103.

The porous silicon remaining on the separation surface is removed by etching. Then, as shown in FIG. 1F, the upper portions of the electrode pads 107 are removed from the single-crystal silicon layer 104.

A color filter and/or anti-reflection film 112 as shown in FIG. 4 is formed. Next, chips are formed from the substrate.

According to the solid-state image sensing apparatus having a three-dimensional structure according to the preferred application example of the present invention, the aperture ratio and incident solid angle can greatly be increased. Accordingly, pixels can easily be formed at a high density. The circuit scale on the second semiconductor substrate side is not particularly limited if it is less than the pixel size. Since memories for the respective memories can be mounted, and two-dimensional parallel signal processing circuits can be arranged, a multifunctional image sensor can be formed.

According to the manufacturing method of the preferred embodiment of the present invention, the step of bonding the first semiconductor substrate to a support substrate before the first semiconductor substrate is bonded to the second semiconductor substrate and the step of removing the support substrate after the first semiconductor substrate bonded to the support substrate is bonded to the second semiconductor substrate can be omitted. For this reason, the manufacturing step can greatly be simplified, and a three-dimensional semiconductor device can be manufactured at a low cost.

According to the present invention, the manufacturing process of a solid-state image sensing element can be simplified. In addition, a solid-state image sensing element which can be manufactured by the simplified manufacturing process can be provided.

As many apparently widely different embodiments of the present invention can be made without departing from the spirit and scope thereof, it is to be understood that the invention is not limited to the specific embodiments thereof except as defined in the claims.

What is claimed is:

1. A method of manufacturing a solid-state image sensing apparatus, the method comprising steps of:

forming a separation layer on a first surface of a first member that has first and second surfaces, and forming first circuit elements above the separation layer, the first circuit elements being two-dimensionally arrayed and each of the first circuit elements including a photoelectric conversion element;

forming second circuit elements and electrode pads on a third surface of a second member that has third and fourth surfaces, wherein the second circuit elements are two-dimensionally arrayed, and wherein each of the second circuit elements corresponds to a respective one of the photoelectric conversion elements and is configured to control the corresponding photoelectric conversion element, to process a signal obtained from the corresponding photoelectric conversion element, and to output the processed signal to a corresponding electrode pad;

making a side of the first surface of the first member oppose a side of the third surface of the second member via a light shielding film, and forming a bonded body of the first member and the second member, such that the first circuit elements are connected to the second circuit elements to compose an image sensor, and such that the light shielding film is arranged between the first circuit elements and the second circuit elements; and separating the first member at the separation layer after the bonded body is formed, wherein the second circuit elements are configured to process signals in parallel, the signals being obtained from corresponding ones of the photoelectric conversion elements, and to output the processed signals to corresponding ones of the electrode pads in parallel.

2. The method according to claim 1, further comprising forming at least one of: an anti-reflection film and a color filter on a side of the second surface of the first member.

3. The method according to claim 1, wherein the first circuit elements include a first electrode having a projecting shape, wherein the second circuit elements include a second electrode having a projecting shape, and wherein the first electrode is connected to the second electrode in the step of making the side of the first surface of the first member oppose the side of the third surface of the second member.

* * * * *